(12) United States Patent
Mochizuki et al.

(10) Patent No.: US 6,261,984 B1
(45) Date of Patent: Jul. 17, 2001

(54) SPUTTERING TARGET AND PROCESS FOR THE PREPARATION THEREOF

(75) Inventors: Osamu Mochizuki, Yokohama; Satoshi Kurosawa, Atsugi; Tsutomu Takahata, Yokohama, all of (JP)

(73) Assignee: Tosoh Corporation, Yamaguchi-ken (JP)

( * ) Notice: Subject to any disclaimer, the term of this patent is extended or adjusted under 35 U.S.C. 154(b) by 0 days.

(21) Appl. No.: 09/414,886

(22) Filed: Oct. 8, 1999

(30) Foreign Application Priority Data

Oct. 8, 1998 (JP) ................................................. 10-287045
May 21, 1999 (JP) ................................................. 11-142233

(51) Int. Cl.$^7$ ............................ C04B 35/14; C04B 35/16

(52) U.S. Cl. ................................................................. 501/133
(58) Field of Search ............................................... 501/133

(56) References Cited

FOREIGN PATENT DOCUMENTS

| 6065725 | 3/1994 | (JP) . |
| 1046328 | 2/1998 | (JP) . |
| 1081960 | 3/1998 | (JP) . |

*Primary Examiner*—Elizabeth D. Wood
(74) *Attorney, Agent, or Firm*—Nixon & Vanderhye

(57) ABSTRACT

A mixture of zinc sulfide and silicon dioxide as starting material powder mixed with zinc oxide in an amount of from 0.5 to 5 wt % is subjected to hot pressing sintering to obtain a sintered body. In this manner, a high density sputtering target using the sintered body can be obtained at a high yield.

16 Claims, 7 Drawing Sheets

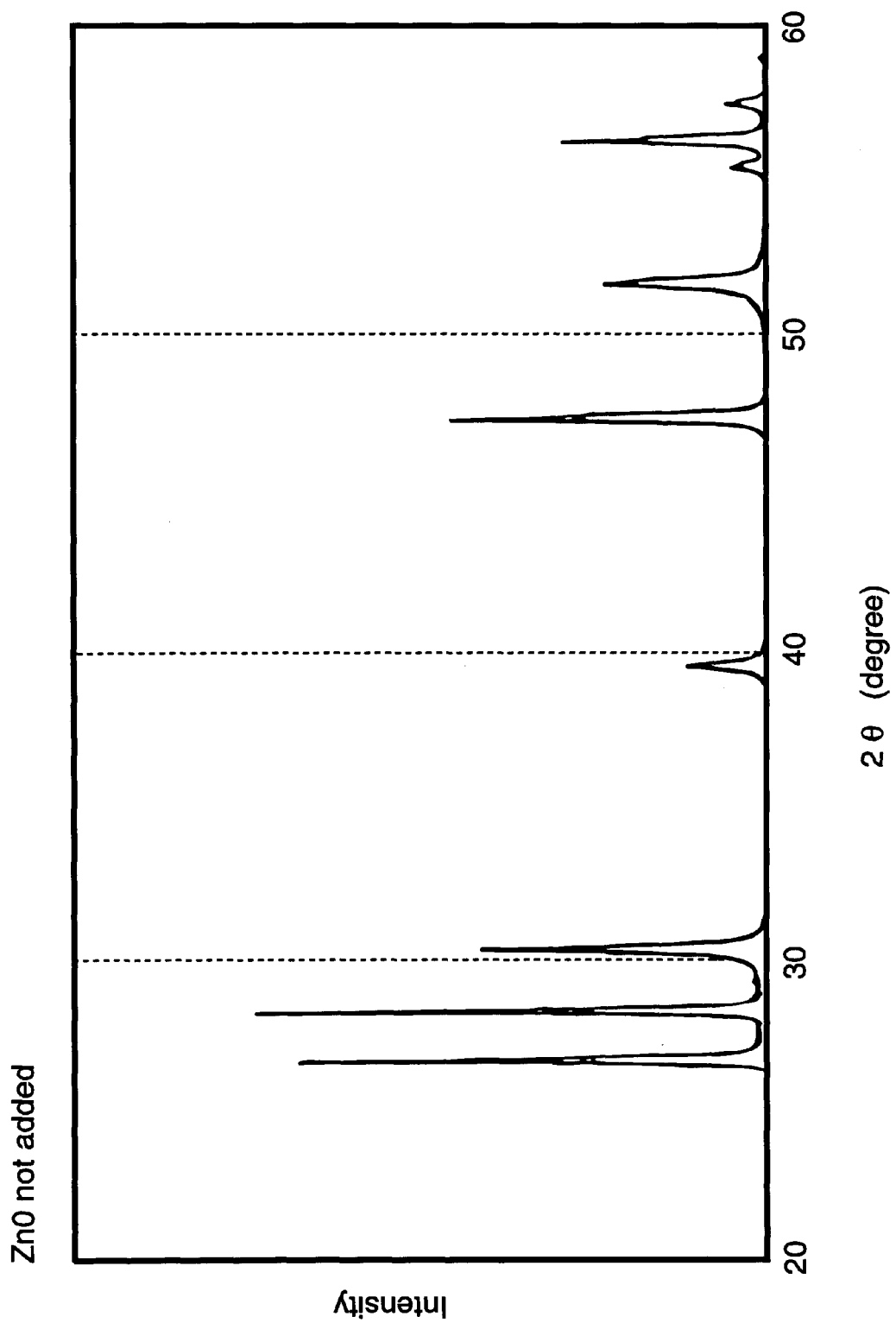

SPUTTERING TARGET AND PROCESS FOR THE PREPARATION THEREOF

BACKGROUND OF THE INVENTION

1. Field of the Invention

The present invention relates to a sputtering target made of a sintered body mainly composed of zinc sulfide and silicon dioxide for use in the formation of a protective layer for an optical recording medium capable of recording, reproducing and erasing data using a light beam, and a process for the preparation thereof.

2. Description of the Related Art As a protective layer for optical disc capable of recording, reproducing and erasing data using light beam, there is used a layer made of a mixture of zinc sulfide (ZnS) and silicon dioxide ($SiO_2$). Further, as a process for the formation of such a protective layer, there is used sputtering process using a sintered body made of zinc sulfide and silicon dioxide as a sputtering target.

The production of the sintered body made of zinc sulfide and silicon dioxide to be used as a sputtering target for use in the formation of a protective layer for an optical recording medium such as optical disc is carried out by a CIP (Cold Isostatic Pressing) process and a HIP (Hot Isostatic Pressing) process in combination, hot pressing process or the like. Among these processes, the hot pressing process is mainly employed on an industrial basis.

However, sintered ceramics made of zinc sulfide and silicon dioxide are liable to crack during production. This defect is known as a main cause that lower the yield. It has been of urgent necessity to prevent cracking occurring during production.

Zinc sulfide and silicon dioxide, which are constituents of a sintered body to be used as a sputtering target for use in the formation of a protective layer for optical recording medium, undergo little solid solution in each other even if sintered under pressure. Further, zinc sulfide and silicon dioxide exhibit different thermal expansion coefficients and thus cause the occurrence of residual stress on the interface of crystalline particles in the sintered body when the sintered body is allowed to cool from the sintering temperature to room temperature during the production of sintered body by sintering. If the sintered body adsorbs water from air with this stress remaining, it shows a volume increase and hence can easily crack.

In particular, in order to obtain a sintered body having a higher density, it is advantageous to sinter the material at high temperatures. However, if the material is sintered at a temperature as high as not lower than the transition temperature of zinc sulfide from zincblende structure to wurtzite structure, the foregoing effect becomes more remarkable, thereby making it difficult to obtain a sintered body free of cracking.

Further, if the sputtering target exhibits a low density, it has a low thermal conductivity and flexural strength and an insufficient mechanical strength and thus cracks during sputtering. Accordingly, a high sputtering power cannot be applied. As a result, the throughput of optical disc cannot be raised. Moreover, such a low density sputtering target has a large number of voids in its structure. These voids form an aggregate of redeposits called "nodule" that gives a source from which particles are produced. The particles can lower the yield of products.

SUMMARY OF THE INVENTION

It is an object of the present invention to provide a high density sputtering target useful for in the formation of a protective layer for optical recording medium which allows high speed film forming, a sintered body having a high sintered density, a high mechanical strength and a high thermal shock resistance from which such a sputtering target can be prepared and a process for the preparation of such a sintered body with simplicity at a good yield using a pressured sintering process such as a hot pressing process.

The present inventors found that cracking can be prevented during sintering and a sintered body having a high density, a high mechanical strength and a high thermal shock resistance can be prepared at a good reproducibility by the following process. In a process for the preparation of a sintered body made of zinc sulfide (ZnS) and silicon dioxide ($SiO_2$) to be used as a sputtering target for use in the formation of a protective layer for optical recording medium, a mixed powder obtained by mixing zinc sulfide and silicon dioxide with zinc oxide (ZnO) as starting materials is sintered under specific hot pressing conditions.

The sputtering target comprising such a sintered body exhibits a raised mechanical strength due to the high sinterability of the sintered body and hence a high thermal shock resistance. Thus, the sputtering target cannot undergo cracking even during operation with a high or sputtering power. Accordingly, knowledge was obtained that a higher sputtering power can be applied, thereby allowing a high sputtering rate and stable sputtering.

The present invention concerns to a sputtering target comprising a sintered body comprising zinc sulfide and silicon dioxide as main components, and further comprising a composite oxide of zinc and silicon. The present invention also concerns to a sputtering target comprising such a sintered body.

The present invention further concerns a sputtering target comprising a sintered body comprising zinc sulfide and silicon dioxide as main components, which satisfies at least one of the following requirements (1) and (2):

(1) The three-point bending strength of the sintered body according to JIS R 1601 shall be not less than 60 MPa; and (2) The thermal conductivity of the sintered body according to JIS R 1611 shall be not less than 9.8 W/m·K. The present invention also concerns to a process for the preparation of a sintered body.

BRIEF DESCRIPTION OF THE DRAWINGS

In the accompanying drawings:

FIG. 1A is a graph illustrating the X-ray diffraction profile of the sintered bodies of Comparative Example 1;

DETAILED DESCRIPTION OF THE INVENTION

Figure 1B:
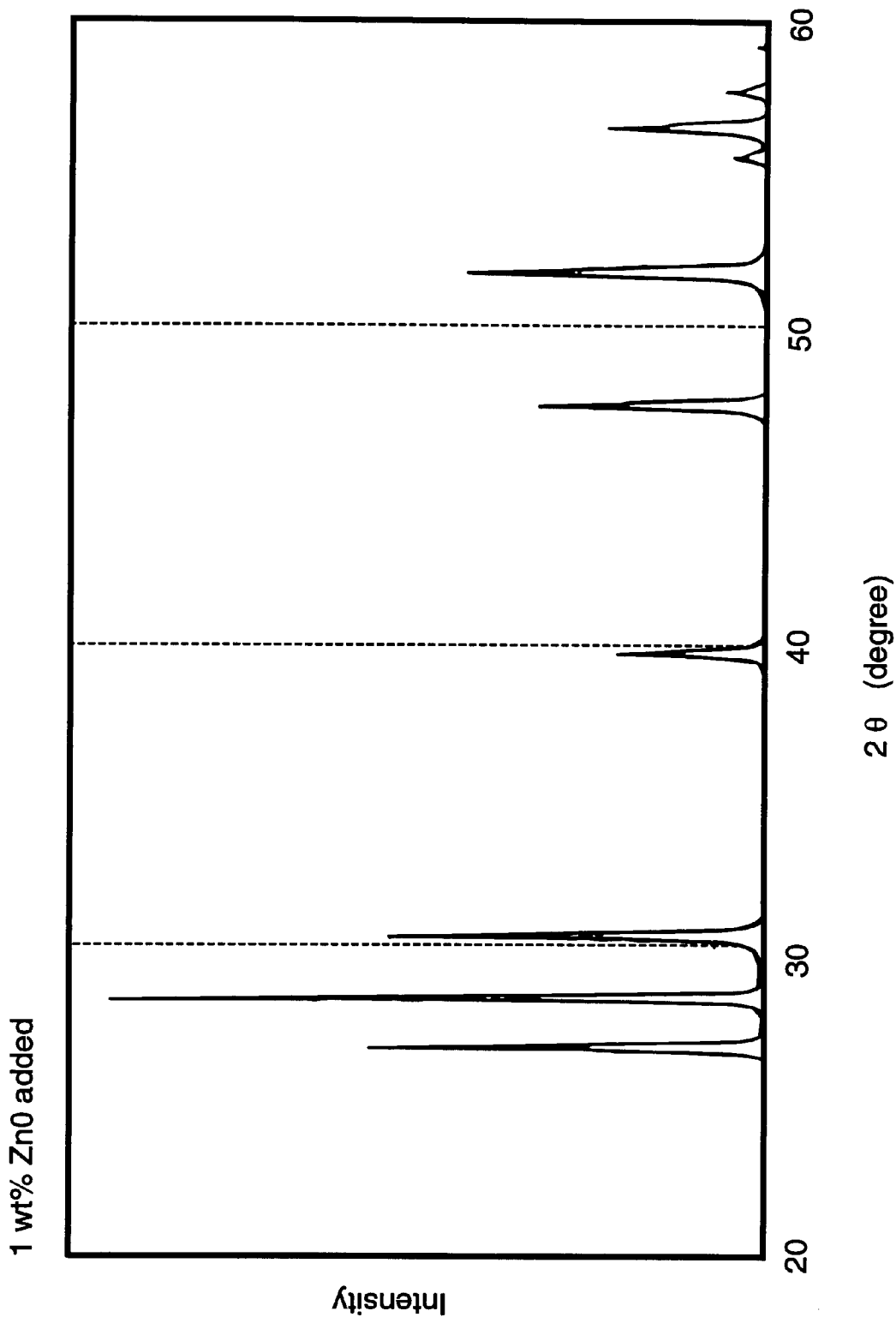
FIG. 1B is a graph illustrating the X-ray diffraction profile of the sintered bodies of Comparative Example 4.

The present invention will be further described hereinafter.

A sintered body according to the present invention can be obtained by uniformly mixing a zinc sulfide powder, a silicon dioxide powder and a zinc oxide powder, and then sintering the mixed powder thus obtained.

The content of the zinc oxide powder in the mixed powder is preferably from 0.5 to 5 wt %, more preferably from more than 0.5 wt % to not more than 5 wt %, even more preferably from 1 to 5 wt %, particularly from 1 to 3 wt % taking into account the effect on the characteristics of the protective layer for optical recording medium obtained by sputtering. If the content of zinc oxide falls below 0.5 wt %, the resulting effect of enhancing the density of the sintered body is insufficient. Further, the material can undergo crack during production, occasionally making it impossible to provide a sufficient enhancement of yield in production. On the contrary, even if the content of zinc oxide exceeds 5 wt %, the effect of enhancing the sintered density is saturated to disadvantage on an economical basis. Further, if the content of zinc oxide is too great, it can affect the characteristics of the protective layer for optical recording medium obtained by sputtering.

Zinc oxide to be added in the present invention is only composed of zinc and oxygen, which are constituents of zinc sulfide and silicon dioxide. Thus, as compared with other sintering additives, zinc oxide can give very little effect on the characteristics of the thin layer thus formed as a protective layer for optical recording medium.

The molar ratio of zinc sulfide powder to silicon dioxide powder in the mixed powder is preferably from 90:10 to 70:30, because this formulation can provide a layer having characteristics most desirable as protective layer for optical recording medium.

The sintering temperature is preferably from 1,000° C. to 1,200° C., more preferably the temperature of transition of zinc sulfide from zincblende structure to wurtzite structure, i.e., from not lower than 1,020° C. to not higher than 1,200° C. If the sintering temperature falls below 1,000° C., a high temperature type zinc sulfide having a wurtzite structure cannot be obtained. In order to exert a desired effect of enhancing the sintered density, it is necessary that calcining be effected under a very high pressure or over an extended period of time. On the contrary, if the sintering temperature exceeds 1,200° C., the formulation of the sintered body can change due to sublimation of zinc sulfide. Moreover, by predetermining the sintering temperature to a range of from not lower than 1,100° C. to not higher than 1,200° C., a sintered body having a higher density can be easily obtained.

The sintered body according to the present invention thus obtained is a sintered body made of zinc sulfide and silicon dioxide as main components, and further containing a composite oxide of zinc and silicon. The content of zinc sulfide and silicon dioxide in the sintered body is preferably not less than 90 wt %, more preferably not less than 95 wt % in total.

As mentioned above, when the mixture of zinc sulfide powder, silicon dioxide powder and zinc oxide powder is sintered under pressure, zinc sulfide and silicon dioxide undergoes little reaction or solid solution, but zinc oxide at least partly reacts with silicon dioxide to produce a composite oxide of zinc and silicon. FIG. 1C indicates X-ray diffraction profile of a sintered body containing zinc oxide incorporated therein in an amount of 5 wt %. As shown in FIG. 1C., a diffraction peak (X) corresponding to the composite oxide of zinc and silicon is observed. In this profile, diffraction peaks other than that indicated by X are all those for high temperature type zinc sulfide having a wurtzite structure. The composite oxide of zinc and silicon shows diffraction peaks at least in the vicinity of 3.49 Å (2θ=25.5), in the vicinity of 2.84 Å (2θ=31.5) and in the vicinity of 2.64 Å (2θ=34.0). As obvious from the comparison with ASTM 8-492 shown in Table 1, zinc orthosilicate ($Zn_2SiO_4$) is considered to be produced.

In the present invention, it is not necessary that all zinc oxides added form a single composite oxide of zinc and silicon. Zinc oxides thus added may partly form other composite oxides or amorphous substances. The diffraction angel 2θ at which the X-ray diffraction peak of the composite oxide of zinc and silicon occurs may occasionally deviate from the above defined value by about ±0.02 Å and thus may not necessarily coincide strictly with 3.49 Å, 2.84 Å and 2.64 Å. Further, even if zinc oxides thus added may partly remain unreacted, there is no special problem as far as they are few to an extent such that they are not recognized on an X-ray diffraction profile.

As mentioned above, the sintered body obtained by sintering a mixed powder obtained by mixing a zinc sulfide powder, a silicon dioxide powder and a zinc oxide powder can exert the desired effect of enhancing the sintered density even when no composite oxide of zinc and silicon is observed on X-ray diffraction profile depending on the added amount of zinc oxide. When any composite oxide of zinc and silicon is observed on X-ray diffraction profile, the desired effect can be exerted more remarkably.

The molar ratio of zinc sulfide to silicon dioxide in the sintered body is preferably from 90:10 to 70:30 because it can provide a layer having characteristics most desirable as a protective layer for optical recording medium.

If the content of zinc oxide in the mixed powder during the production of sintered body is from 0.5 to 5 wt %, and all zinc oxides form zinc orthosilicate ($Zn_2SiO_4$), the content of zinc orthosilicate ($Zn_2SiO_4$) in the sintered body is from 0.68 to 6.8 wt %.

Further, by increasing the density of the sintered body, the mechanical strength of the sputtering target can be enhanced, making it possible to apply a high sputtering power. At the same time, the production of particles can be minimized. Thus, the relative density of the sintered body constituting the sputtering target of the present invention is preferably not less than 95%, more preferably not less than 97%. The greater the relative density of the sintered body constituting the sputtering target of the present invention is, the more effective is the present invention. Thus, the relative density of the sintered body is preferably as close to 100% as possible. Accordingly, the relative density of the sintered body is preferably from 95% to 100%, more preferably from 97% to 100%.

For the measurement of the bulk density of the sintered body, Archimedes' method may be used for example. It is occasionally difficult to calculate the exact value of the relative density of the sintered body because the kind and content of the composite oxide of zinc and silicon contained in the sintered body is not definite and the exact theoretical density of the sintered body is thus unknown. In this case, the theoretical density determined on the assumption that the sintered body consists of zinc sulfide, silicon dioxide and zinc oxide may be used instead of that of the above mentioned sintered body. In this case, the theoretical density thus determined is about 0.03% smaller than that determined on the assumption that all zinc oxides thus added form zinc orthosilicate when the content of zinc oxide is 5 wt %.

The sintered body according to the present invention is made of zinc sulfide and silicon dioxide as main components, and satisfies at least one of the following requirements (1) and (2):

(1) The three-point bending strength of the sintered body according to JIS R 1601 shall be not less than 60 MPa; and (2) The thermal conductivity of the sintered body according to JIS R 1611 shall be not less than 9.8 W/m·K.

For the measurement of the three-point bending strength of the sintered body, JIS R 1601 (1995) (Method for testing the bending strength of fine ceramics) may be used. In some detail, a 36×4×3 mm specimen is cut out of the sintered body.

The three-point bending strength of the sintered body is directly related to the mechanical strength of the sintered body. The greater the three-point bending strength of the sintered body is, the more insusceptible to cracking due to mechanical impact or thermal shock is the sintered body. By predetermining the three-point bending strength of the sintered body to not less than 60 MPa, the sintered body can be prevented from undergoing cracking during production or sputtering. The upper limit of the three-point bending strength is not specifically limited. In practice, however, the upper limit of the three-point bending strength of the sintered body is preferably from 60 to 80 MPa, more preferably from 68 to 80 MPa, as far as its effect can be confirmed.

For the measurement of the thermal conductivity of the sintered body, JIS R 1611 (1991) (Method for testing the thermal diffusivity, specific heat capacity and thermal conductivity of fine ceramics by laser flash process) may be used. A specimen having an inscribed circle and circumcircle section with a diameter of from 8 to 10 mm and a thickness of not more than 4 mm is cut out of the sintered body. Using the equation $\kappa = \alpha \cdot C \cdot \rho$ (in which $\kappa$ is the thermal conductivity, $\alpha$ is the measured value of thermal diffusivity, $C$ is the specific heat apacity and $\rho$ is the bulk density of the specimen), the thermal conductivity is calculated. Further, the bulk density of the specimen can be measured by Archimedes' method.

The greater the thermal conductivity of the sintered body is, the higher is the cooling effect during sputtering and the more insusceptible to cracking due to thermal shock is the sintered body. Thus, even if the sintered body is used at a higher sputtering power, it doesn't undergo cracking, making it possible to attain high speed and stable film forming. By predetermining the thermal conductivity of the sintered body to not less than 9.8 W/m·K, it is made possible to sufficiently prevent the occurrence of cracking during sputtering. The upper limit of the thermal conductivity of the sintered body is not specifically limited. In practice, however, it is preferably from 9.8 to 12.8 W/m·K, more preferably from 11.2 to 12.8 W/m·K, as far as its effect can be confirmed.

The relative density of the sintered body of the present invention is preferably not less than 95%, more preferably not less than 97%. Further, the foregoing sintered body is preferably made of high temperature type having a wurtzite structure zinc sulfide. The foregoing sintered body is preferably not observed to show (200) diffraction from low temperature type zinc sulfide having a zincblende structure when subjected to ordinary X-ray diffraction measurement for identification of substance. However, even if traces of peak are observed, it suffices when the ratio of integrated intensity ($I_\beta(200)$) of (200) diffraction of low temperature type zinc sulfide having a zincblende structure to integrated intensity $I_\alpha(100)$ of (100) diffraction of high temperature type zinc sulfide having a wurtzite structure ($I_\beta(200)/I_\alpha(100)$) is not more than 0.01, particularly not more than 0.001. In other words, the intensity ratio ($I_\beta(200)/I_\alpha(100)$) is preferably from 0 to 0.01, more preferably from 0 to 0.001.

As ordinary measuring conditions under which quantitative analysis is effected in x-ray diffraction measurement of sintered body, there may be exemplified CuK $\alpha_1$ as characteristic X-ray, 50 kV as applied voltage, 200 mA as target current, 0.2°/min as scan speed, 0.5° as dispersion slit width, 0.5° as scattering slit width and 0.15 mm as light-receiving slit width. If CuK$\alpha_1$ is used as characteristic X-ray, (100) diffraction from the high temperature type zinc sulfide having a wurtzite structure is obtained as a diffraction peak at a diffraction angle 2θ of around 26.9° (d=3.309 Å) while (200) diffraction from the low temperature type zinc sulfide having a zincblende structure is obtained as a diffraction peak at a diffraction angle 2θ of around 33.10°(d =2.705 Å).

Referring to the foregoing sintered body made of zinc sulfide and silicon dioxide as main components and further containing a composite oxide of zinc and silicon, the ratio of integrated intensity ($I_\beta(200)$) of (200) diffraction of low temperature type zinc sulfide having a zincblende structure to integrated intensity ($I_\alpha(100)$) of (100) diffraction of high temperature type zinc sulfide having a wurtzite structure ($I_\beta(200)/I_\alpha(100)$) is preferably not more than 0.01, more preferably not more than 0.001.

Referring further to the process for the preparation of the sintered body of the present invention, zinc sulfide, silicon dioxide and zinc oxide are mixed as starting material powders in a predetermined proportion, and then uniformly mixed, e.g., in a ball mill. The mixed powder thus obtained is then packed in a graphite mold. The mixed powder thus packed is then sintered under hot pressing conditions, i.e., from 200 to 300 kg/cm² as pressure, from 1,000 to 1,2000° C. as temperature, from 1 to 5 hours as time, from 200 to 300° C./hr as heating rate and from 200 to 300° C./hr as cooling rate, in an argon atmosphere or in vacuo. If the heating rate is greater than 300° C./hr, residual stress is developed in the sintered body during cooling, occasionally causing the occurrence of defects such as cracking in the sintered body. Thus, the cooling rate is preferably not more than 200° C./hr.

The zinc sulfide powder, silicon dioxide powder and zinc oxide powder to be used as starting materials of the sintered body of the present invention are not specifically limited. Commercially available products may be used as such. In practice, however, a zinc sulfide powder having an average particle diameter of not more than 10 μm, a silicon dioxide powder having an average particle diameter of not more than 10 μm and a zinc oxide powder having an average particle diameter of not more than 5 μm are preferably used to obtain a sintered body having a higher uniformity and density.

Further, the silicon dioxide powder to be used may be composed of spherical particles. However, the use of a silicon dioxide powder having an irregular shape with many corners and an average particle diameter of not less than 10 μm obtained by grinding relatively large particles having no specific shape makes it possible to effectively prevent the silicon dioxide particles from falling off from the sintered body and hence prevent the production of particles during sputtering more effectively.

Moreover, silicon dioxide to be used in the present invention may have some oxygen defects and silicon defects. Both silicon dioxide contained in the sintered body and silicon dioxide to be used as starting material may not necessarily have an oxygen to silicon atomic ratio (O/Si) of 2.

The sintered body thus obtained is then subjected to dry or wet machining so that it is worked into predetermined shape. If necessary, the sintered body thus machined is then bonded to a backing plate so that the heat developed during sputtering can be effectively released. Thus, a sputtering target according to the present invention is prepared. In particular, the present invention allows easy preparation of a large-sized sintered body. A columnar sintered body (ingot) is sliced to obtain a plurality of disc-shaped target materials. If necessary, the disc-shaped target is shaped, polished, and then bonded to a backing plate to prepare a sputtering target according to the present invention. The columnar sintered body (ingot) may be sized to a diameter of from 75 mm to 250 mm and a height of 100 mm so that about 12 sheets of target materials having a thickness of 6 mm can be obtained.

The shape of the sputtering target can be properly selected according to the sputtering apparatus to be used. For example, a circle having a diameter of from 3 to 8 inch or a rectangle having a size of 4 to 6 inch×5 to 20 inch is ordinary. The thickness of the sputtering target is normally from about 3 to 20 mm.

EXAMPLES

The present invention will be further described in the following examples, but the present invention should not be construed as being limited thereto.

Examples 1, 2

As starting materials, there were used a ZnS powder having an average particle diameter of 5 $\mu$m, an $SiO_2$ powder having an average particle diameter of 5 $\mu$m and a ZnO powder having an average particle diameter of 0.5 $\mu$m.

The ZnS powder and the $SiO_2$ powder were blended at a molar ratio of 80:20. To the mixture was then added the ZnO powder in an amount of 0.5 wt % based on the total weight thereof. The mixture was put in a resin pot with zirconia balls, and then stirred by means of a ball mill for 16 hours. The mixed powder thus obtained was packed in a graphite mold, and then subjected to hot pressing sintering in vacuo at a temperature of 1,100° C. (Example 1) or 1,150° C. (Example 2) under a pressure of 200 kg/cm² to prepare a sintered body. During this procedure, the heating rate and cooling rate were each 200 ° C./hr, and the detention time was 5 hours.

The various sintered bodies thus obtained were each worked into a disc (thickness: 5 mm; diameter: 200 mmØ), and then bonded to a copper backing plate to obtain sputtering targets.

Examples 3 to 6

As starting materials, there were used a ZnS powder having an average particle diameter of 5 $\mu$m, an $SiO_2$ powder having an average particle diameter of 5 $\mu$m and a ZnO powder having an average particle diameter of 0.5 $\mu$m.

The ZnS powder and the $Sio_2$ powder were blended at a molar ratio of 80:20. To the mixture was then added the Zno powder in an amount of 1 wt % (Examples 3, 4) or 5 wt % (Examples 5, 6) based on the total weight thereof. The mixture was put in a resin pot with zirconia balls, and then stirred by means of a ball mill for 16 hours. The mixed powder thus obtained was packed in a graphite mold, and then subjected to hot pressing sintering in vacuo at a temperature of 1,100° C. (Examples 3, 5) or 1,150° C. (Examples 4, 6) under a pressure of 200 kg/cm² to prepare a sintered body. During this procedure, the heating rate and cooling rate were each 200° C./hr, and the detention time was 3 hours.

The various sintered bodies thus obtained were each worked into a disc (thickness: 5 mm; diameter: 200 mm), and then bonded to a copper backing plate to obtain sputtering targets.

Comparative Examples 1, 2

Sputtering targets were prepared in the same manner as in Examples 3 to 6 except that the ZnO powder was not added (sintering temperature: 1,100° C. (Comparative Example 1) 1,150° C. (Comparative Example 2)).

The added amount of ZnO and sintering conditions in Examples 1 to 6 and Comparative Examples 1 and 2 are set forth in Table 2.

In Examples 1 to 6 and Comparative Examples 1 and 2, the sintered bodies were each observed to see if they undergo cracking during production. The resulting sintered bodies were each then subjected to X-ray diffraction measurement and measured for three-point bending strength, thermal conductivity and density. The resulting sputtering targets were each evaluated for sputtering properties.

For X-ray diffraction measurement, X-ray characteristic to $CuK\alpha_1$ was used. In addition to ordinary qualitative analysis, measurements were effected using a monochrometer at an applied voltage of 50 kV, a target current of 200 mA and a scanning rate of 0.2°/min. The width of the dispergence slit, scatter slit and receiving slit used were 0.5°, 0.5° and 0.15 mm, respectively. The number of integration was 5. The measurement was made at diffraction angles 2θ of from 21.0 to 23.0, from 25.0 to 26.0, from 31.0 to 35.0 and from 48.0 to 5.0.

For the measurement of three-point bending strength, 10 specimens having a size of 36×4×3 mm were cut out of the sintered bodies obtained in Examples 1 to 6 and Comparative Examples 1 and 2. Using a Type Autograph AG-2000B bending strength tester (produced by Shimadzu Corp.), measurement was made at a cross head speed of 0.5 mm/min in accordance with JIS R 1601.

For the measurement of the thermal conductivity of the sintered body, a sheet of disc-shaped specimen having a diameter of 10 mm and a thickness of 1 mm was cut out of the sintered bodies obtained in Examples 1 to 6 and Comparative Examples 1 and 2. Using a thermal constants analyzer ("Standard Laser Flash Thermal Constants Analyzer TC7000", produced by Shiku-Riko Inc.), measurement was made in accordance with JIS R 1611. The measurements were then subjected to calculation by the equation $\kappa=\alpha \cdot C \cdot \rho$ (in which $\kappa$ is the thermal conductivity, $\alpha$ is the measured value of thermal diffusivity, C is the specific heat capacity and $\rho$ is the bulk density of the specimen) to determine the thermal conductivity. The bulk density of the specimen was measured by Archimedes' method.

Further, the relative density of the sintered body was calculated from the bulk density measured by Archimedes method. The theoretical density of the sintered body was calculated on the assumption that the sintered body consists of zinc sulfide, silicon dioxide and zinc oxide. In some details, as the theoretical density of zinc sulfide, silicon dioxide and zinc oxide there were used 4.09 g/cm³, 2.20 g/cm³ and 5.78 g/cm³, respectively. As the theoretical density of the sintered body, there was used 3.67 g/cm³ for Comparative Examples 1 and 2, 3.68 g/cm³ for Examples 1 to 4 or 3.74 g/cm³ for Examples 5 and 6.

For the evaluation of sputtering properties, an RF magnetron sputtering apparatus was used. In some details, sputtering was effected at an argon pressure of 0.4 Pa and an applied sputtering power of 300 W for 1 minute. Sputtering was further effected until the life of the target expired at an argon pressure of 0.4 Pa and an applied power of 300 W. Under these conditions, the sputtering target was examined for cracking.

Figure 1C:
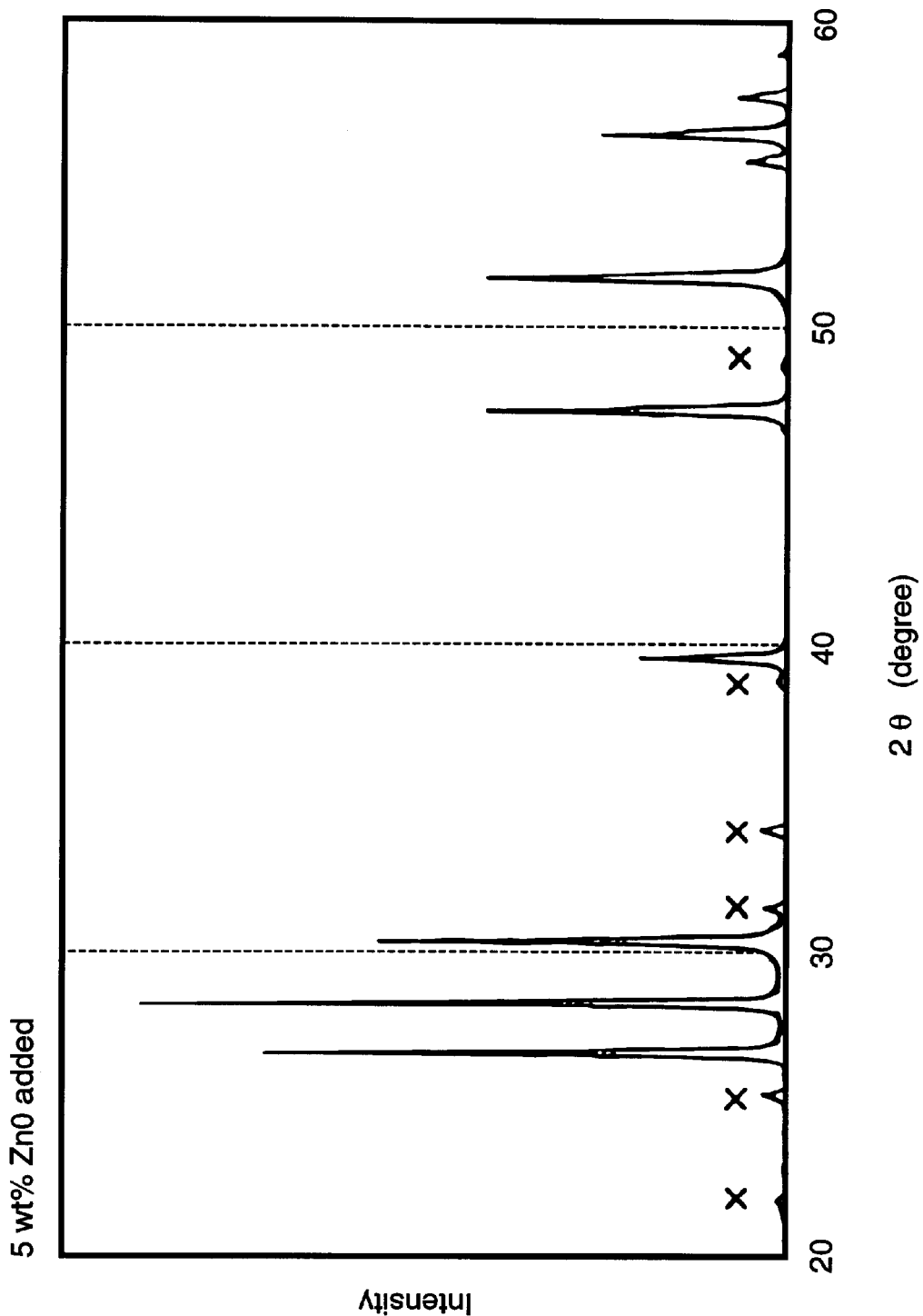
FIG. 1C is a graph illustrating the X-ray diffraction profile of the sintered bodies of Comparative Example 6.

FIGS. 1A to 1C show the X-ray diffraction profile of the sintered body thus obtained. FIG. 1A shows the X-ray diffraction profile of Comparative Example 2, which is free of ZnO. FIG. 1B shows the X-ray diffraction profile of Example 4, in which the added amount of ZnO is 1 wt %. FIG. 1C shows the X-ray diffraction profile of Example 6, in which the added amount of ZnO is 5 wt %. In FIG. 1C., X indicates the diffraction peak of the composite oxide of zinc and silicon. All the other diffraction peaks are those of high temperature type zinc sulfide. FIGS. 2A to 2D shows the X-ray diffraction profile obtained by the measurement under the same conditions as mentioned above, which show conditions of angles 2θ from 21.0 to 23.0, from 25.0 to 26.0, from 31.0 to 35.0 and from 48.0 to 50.0, respectively. In FIGS. 2A to 2D, symbols a, b, and c indicate the X-ray diffraction profile of the sintered bodies obtained in Comparative Example 2, Example 4 and Example 6, respectively.

Table 1 shows the comparison of the position of diffraction peak obtained from the X-ray diffraction profile of the sintered body obtained in Example 6 with that of zinc orthosilicate ($Zn_2SiO_4$) (ASTM 8-492). As can be seen in these figures and table, the sintered body containing ZnO incorporated therein shows diffraction peak at least at 3.49 Å, 2.84 Å and 2.64 Å, possibly demonstrating that zinc orthosilicate ($Zn_2SiO_4$) is formed.

All these results are about those sintered at a temperature of 1,150° C. Almost the same results as mentioned above were obtained with the X-ray diffraction profile of the sintered bodies obtained in Comparative Example 1 and Examples 3 and 5, the sintering temperature of which was 1,100° C.

Examples 1 and 2, each of which contains ZnO in an amount of 0.5 wt %, show no diffraction peak characteristic to ZnO or composite oxide besides that characteristic to high temperature type zinc sulfide.

Figure 2A:
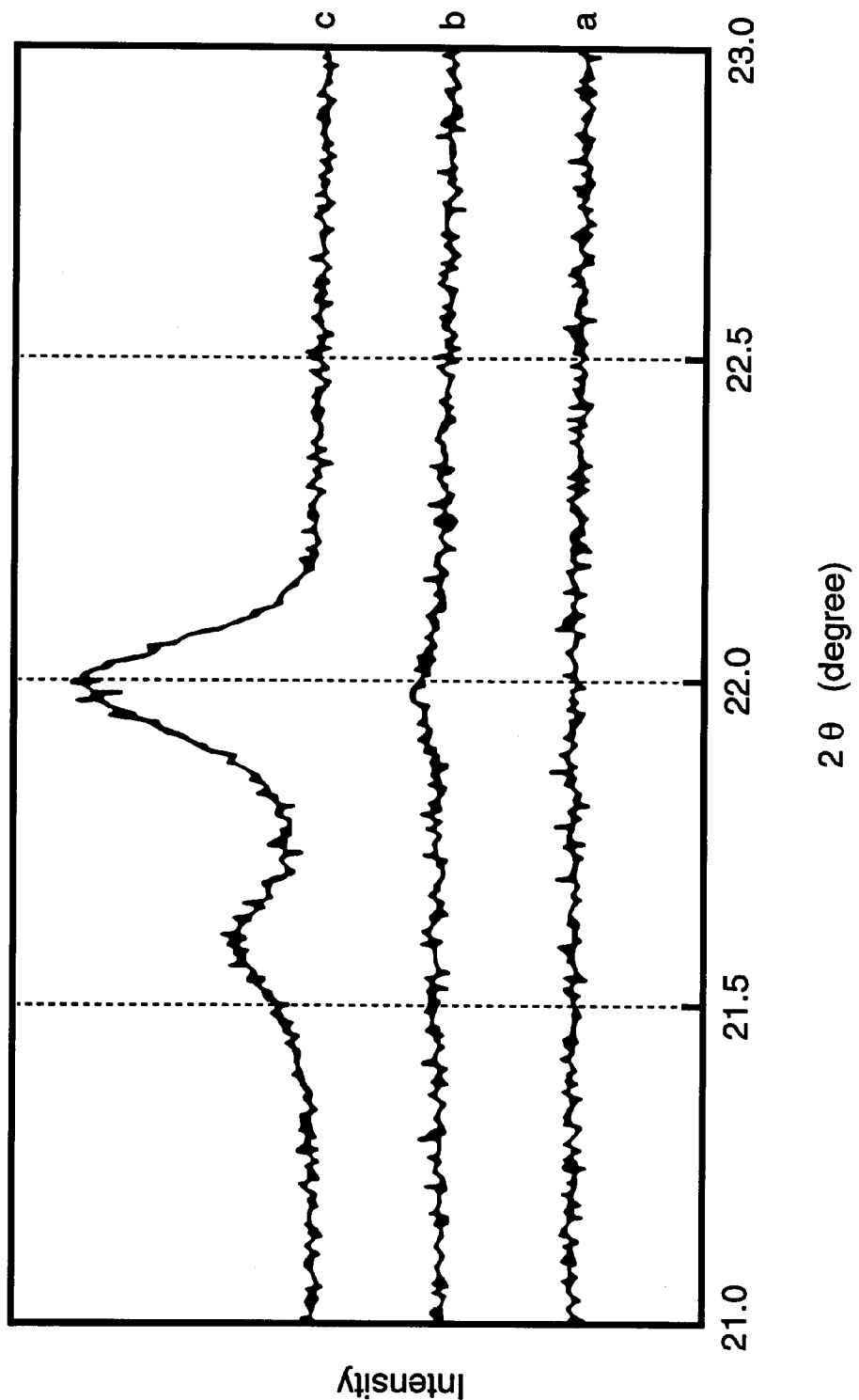
FIG. 2A is a graph illustrating the detailed X-ray diffraction profile of sintered bodies measured in Comparative Example 2(*a*), Example 4(*b*) and Example 6(*c*) at an angle 2θ from 21.0 to 23.0.
Figure 2B:
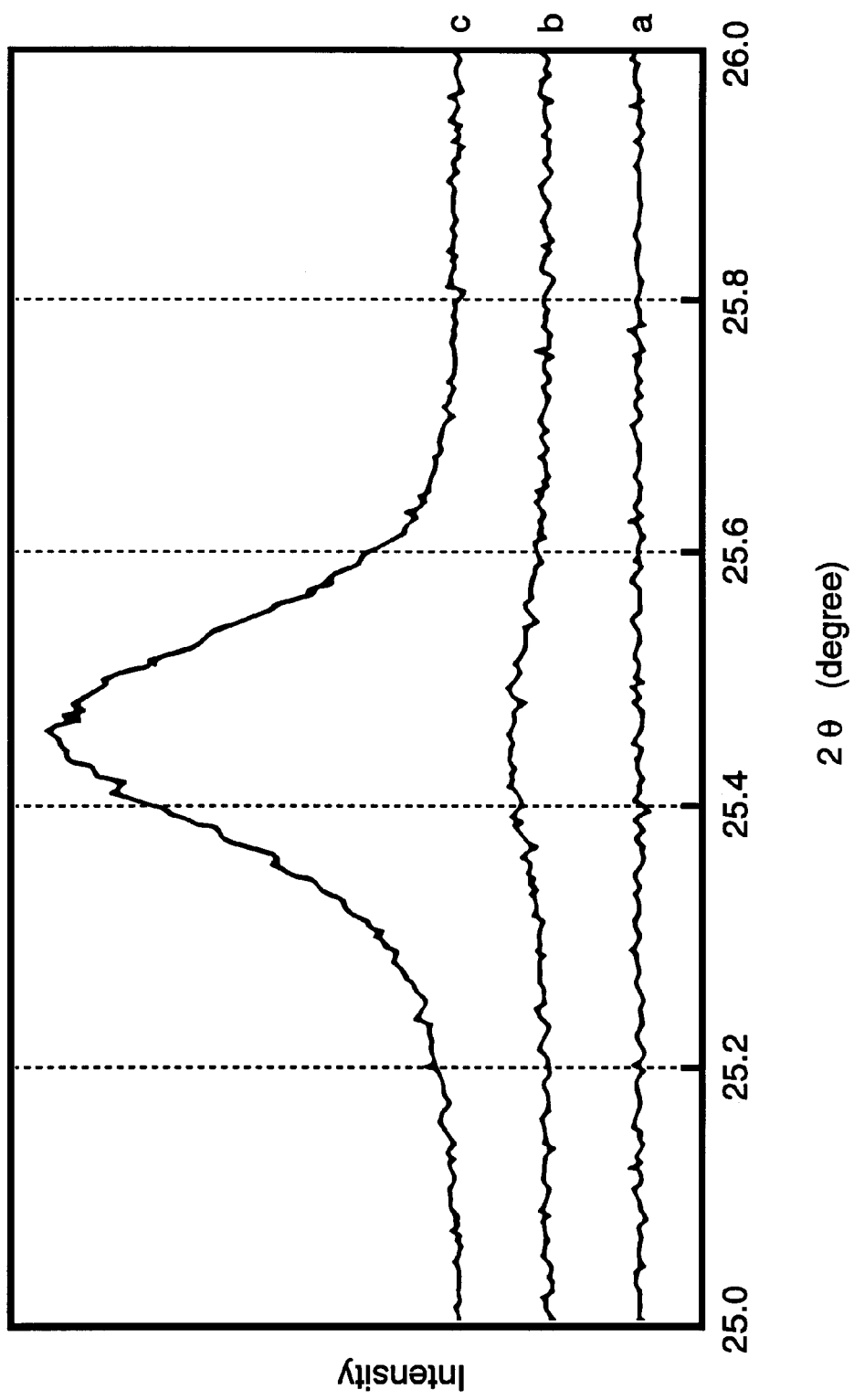
FIG. 2B is a graph illustrating the detailed X-ray diffraction profile of sintered bodies measured in Comparative Example 2(*a*), Example 4(*b*) and Example 6(*c*) at an angle 2θ from 25.0 to 26.0.
Figure 2C:
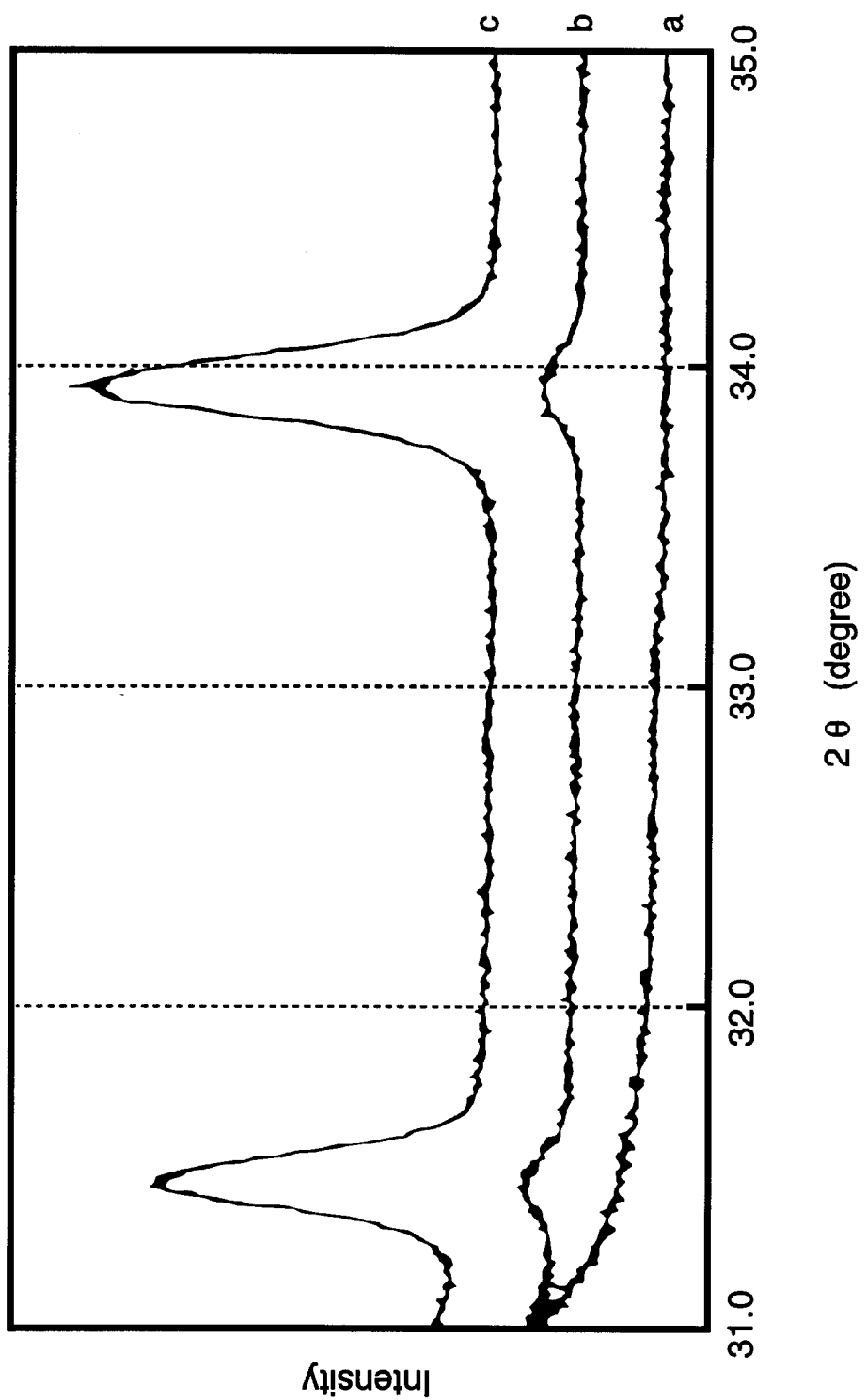
FIG. 2C is a graph illustrating the detailed X-ray diffraction profile of sintered bodies measured in Comparative Example 2(*a*), Example 4(*b*) and Example 6(*c*) at an angle 2θ from 31.0 to 35.0.
Figure 2D:
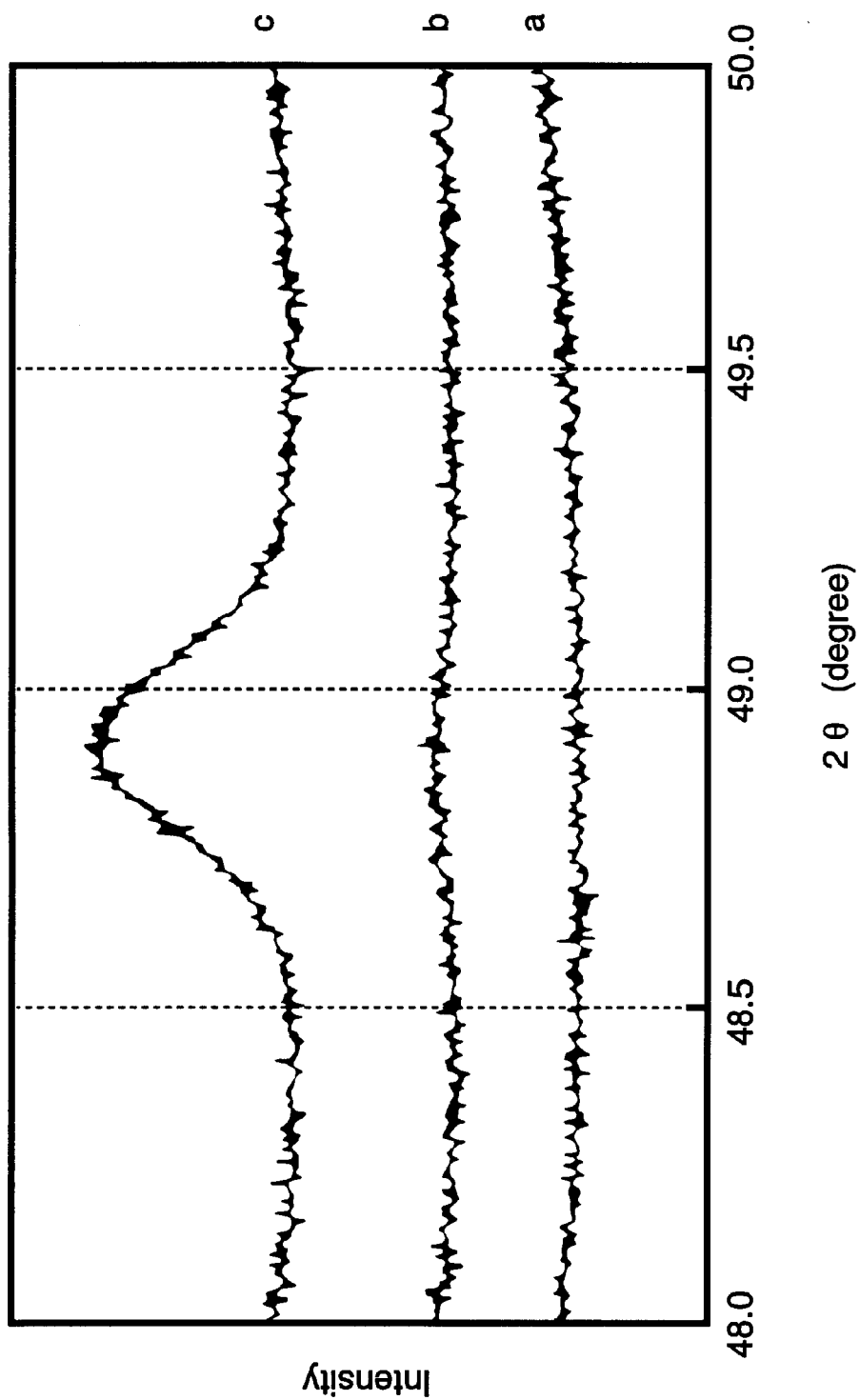
FIG. 2D is a graph illustrating the detailed X-ray diffraction profile of sintered bodies measured in Comparative Example 2(a), Example 4(b) and Example 6(c) at an angle 2θ from 48.0 to 50.0.

As the results of Comparative Example 2 and Examples 4 and 6 are illustrated by way of example in the graph for diffraction angle 2θ of from 31 to 35° of FIG. 2C, none of the sintered bodies of Examples 1 to 6 and Comparative Examples 1 and 2 shows (200) diffraction (2θ=33.1° (d=2.705 Å)) from low temperature type zinc sulfide having zincblende structure.

TABLE 1

| Example 6 | | $Zn_2SiO_4$ (ASTM: 8–492) | | |
|---|---|---|---|---|
| 2θ | d Å | d Å | I/I₁ | hkl |
| — | — | 4.100 | 17 | 211 |
| 22.0 | 4.037 | 4.026 | 33 | 300 |
| 25.5 | 3.490 | 3.486 | 81 | 220 |
| 31.5 | 2.838 | 2.834 | 97 | 113 |
| 34.0 | 2.635 | 2.634 | 100 | 140 |
| — | — | 2.318 | 47 | 223 |
| 48.9 | 1.861 | 1.859 | 36 | 333 |

Table 2 shows the preparation conditions such as added amount of ZnO, sintering temperature and sintering pressure in Examples 1 to 6 and Comparative Examples 1 and 2 and their results of the three-point bending strength, thermal conductivity, relative density, occurrence of cracking during sintering and in evaluation of sputtering properties, etc.

As can be seen in Table 2, the sputtering targets containing ZnO incorporated therein in an amount of from 0.5 to 5 wt % (Examples 1 to 6) exhibit a three-point bending strength of not less than 60 MPa, a thermal conductivity of not less than 9.8 W/m·K and a relative density of not less than 95% and thus undergo no cracking both during sintering and sputtering. On the contrary, the sputtering targets free of ZnO (Comparative Examples 1, 2) exhibit a three-point bending strength of not more than 56 MPa, a thermal conductivity of not more than 9.5 W/m·K and a relative density of not more than 95.6% and undergo cracking during sintering. The sputtering targets prepared from the sintered bodies left uncracked undergo cracking during sputtering. Referring to the observation of the amount of particles produced during sputtering, the sputtering targets prepared in Examples 1 to 6 show very little production of particles and exhibit very good performance as compared with those of Comparative Examples 1 and 2.

TABLE 2

| | Examples | | | | | | Comparative Examples | |
|---|---|---|---|---|---|---|---|---|
| Target | 1 | 2 | 3 | 4 | 5 | 6 | 1 | 2 |
| Added amount of ZnO (wt %) | 0.5 | 0.5 | 1.0 | 1.0 | 5.0 | 5.0 | 0 | 0 |
| Sintering temperature (° C.) | 1100 | 1150 | 1100 | 1150 | 1100 | 1150 | 1100 | 1150 |
| Pressure (kg/cm²) | 200 | 200 | 200 | 200 | 200 | 200 | 200 | 200 |
| Relative density (%) | 95.4 | 97.1 | 97.5 | 99.0 | 97.9 | 99.3 | 93.3 | 95.6 |
| Three-point bending strength (Mpa) | 60 | 66 | 68 | 78 | 70 | 80 | 46 | 56 |

TABLE 2-continued

| Target | Examples | | | | | | Comparative Examples | |
|---|---|---|---|---|---|---|---|---|
| | 1 | 2 | 3 | 4 | 5 | 6 | 1 | 2 |
| Thermal conductivity (W/m · K) | 9.8 | 10.8 | 11.2 | 12.4 | 11.6 | 12.8 | 8.0 | 9.5 |
| Cracked during sintering? | No | No | No | No | No | No | Yes | Yes |
| Cracked during Sputtering? | No | No | No | No | No | No | Yes | Yes |

As mentioned above, in accordance with the present invention, a sintered body containing zinc sulfide and silicon dioxide as main components having a very high sintered density, a high mechanical strength and a high thermal shock resistance can be obtained. The sintered body according to the present invention can be used to form a sputtering target to advantage. In particular, in accordance with the present invention, a large-sized sintered body can be easily prepared. For example, a columnar or prismatic sintered body (ingot) may be cut and divided into a plurality of target materials, making it easy to produce a sputtering target at a low cost.

The sputtering target according to the present invention undergoes no cracking during its preparation, thereby making it possible to drastically raise the yield in production. In addition, a sputtering target having a very high density can be obtained. Such a sputtering target exhibits a high strength and excellent thermal properties. Accordingly, the use of such a sputtering target makes it possible to form a film invariably at a high speed without cracking even when sputtering is effected at a high sputtering power.

What is claimed is:

1. A sputtering target comprising a sintered body comprising zinc sulfide, silicon dioxide and a composite oxide of zinc and silicon.

2. The sputtering target according to claim 1, wherein a relative density of said sintered body is not less than 95%.

3. The sputtering target according to claim 1, wherein a total amount of zinc sulfide and silicon dioxide is not less than 90 wt %.

4. The sputtering target according to claim 1, wherein a molar ratio of zinc sulfide to silicon dioxide is in the range of 90:10 to 70:30.

5. The sputtering target according to claim 1, wherein said composite oxide of zinc and silicon has an X-ray diffraction peak at 3.49 Å, 2.84 Å and 2.64 Å.

6. The sputtering target according to claim 1, wherein said composite oxide of zinc and silicon is zinc orthosilicate ($Zn_2SiO_4$).

7. The sputtering target according to claim 1, wherein a ratio of integrated intensity ($I_\beta(200)$) of (200) diffraction of low temperature type zinc sulfide having azincblende structure to integrated intensity ($I_\alpha(100)$) of (100) diffraction of high temperature type zinc sulfide having a wurtzite structure ($I_\beta(200)/I_\alpha(100)$) in X-ray diffraction measurement of the sintered body is not more than 0.01.

8. The sputtering target according to claim 1, wherein at least one of the following requirements (1) and (2) is satisfied:

(1) a three-point bending strength of the sintered body according to JIS R 1601 is not less than 60 MPa; and (2) a thermal conductivity of the sintered body according to JIS R 1611 is not less than 9.8 W/m·K.

9. The sputtering target comprising zinc sulfide and silicon dioxide, wherein at least one of the following requirements (1) and (2) is satisfied:

(1) a three-point bending strength of the sintered body according to JIS R 1601 is not less than 60 MPa; and (2) a thermal conductivity of the sintered body according to JIS R 1611 is not less than 9.8 W/m·K.

10. The sputtering target according to claim 9, wherein a ratio of integrated intensity ($I_{62}(200)$) of (200) diffraction of low temperature type zinc sulfide having a zincblende structure to integrated intensity ($I_\alpha(100)$) of (100) diffraction of high temperature type zinc sulfide having a wurtzite structure ($I_\beta(200)/I_\alpha(100)$) in X-ray diffraction measurement of the sintered body is not more than 0.01.

11. The sputtering target according to claim 9, wherein a relative density of said sintered body is not less than 95%.

12. A sputtering target comprising a sintered body comprising zinc sulfide and silicon dioxide, which is prepared by sintering a mixed powder obtained by mixing a zinc sulfide powder, a silicon dioxide powder and not less than 0.5 wt % to not more than 5 wt %, based on the total weight of the mixed powder, of a zinc oxide powder, said sintering is conducted at a pressure of from 200 to 300 kg/cm² and a temperature of from 1,000 to 1,200° C.

13. The sputtering target according to claim 12, wherein said mixed powder is sintered at a temperature of not lower than the temperature of transition of zinc sulfide from zincblende structure to wurtzite structure.

14. A process for preparation of a sputtering target comprising the steps of:

mixing a zinc sulfide powder, a silicon dioxide powder and not less than 0.5 wt % to not more than 5 wt %, based on the total weight of the mixed powder, of a zinc oxide powder, and sintering the mixed powder thus obtained at a pressure of from 200 to 300 kg/cm² and a temperature of from 1,000 to 1,200° C.

15. The process according to claim 14, wherein said mixed powder is sintered at a temperature of not lower than the temperature of transition of zinc sulfide from zincblende structure to wurtzite structure.

16. The process according to claim 14, wherein the zinc sulfide powder has an average particle diameter of not more than 10 μm, the silicon dioxide powder has an average particle diameter of not more than 10 μm and the zinc oxide powder having an average particle diameter of not more than 5 μm.

* * * * *